US009825250B2

(12) United States Patent
Yokota et al.

(10) Patent No.: US 9,825,250 B2
(45) Date of Patent: Nov. 21, 2017

(54) LIGHT-EMITTING ELEMENT, DISPLAY DEVICE, AND METHOD FOR MANUFACTURING LIGHT-EMITTING ELEMENT

(71) Applicant: JOLED INC., Tokyo (JP)

(72) Inventors: Kazuhiro Yokota, Tokyo (JP); Yuuki Abe, Tokyo (JP); Yasuharu Shinokawa, Tokyo (JP); Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 18 days.

(21) Appl. No.: 14/897,021

(22) PCT Filed: Jun. 30, 2014

(86) PCT No.: PCT/JP2014/003468
§ 371 (c)(1),
(2) Date: Dec. 9, 2015

(87) PCT Pub. No.: WO2015/001785
PCT Pub. Date: Jan. 8, 2015

(65) Prior Publication Data
US 2016/0126489 A1    May 5, 2016

(30) Foreign Application Priority Data

Jul. 4, 2013 (JP) ................. 2013-141159

(51) Int. Cl.
*H01L 51/52* (2006.01)
*H01L 51/50* (2006.01)
*H01L 51/56* (2006.01)

(52) U.S. Cl.
CPC ...... *H01L 51/5218* (2013.01); *H01L 51/5088* (2013.01); *H01L 51/5096* (2013.01);
(Continued)

(58) Field of Classification Search
CPC ............. H01L 51/5218; H01L 51/5088; H01L 51/5096; H01L 51/5215; H01L 51/56; H01L 2251/308; H01L 2251/558
See application file for complete search history.

(56) References Cited

U.S. PATENT DOCUMENTS 8,552,637 B2  10/2013  Yamamoto
2004/0081836 A1*  4/2004  Inoue ................... C04B 35/01
                                                   428/469
(Continued)

FOREIGN PATENT DOCUMENTS

JP    2011-034711    2/2011
JP    2012-048992    3/2012
(Continued)

OTHER PUBLICATIONS

Office Action from Japanese Patent Office in Japanese Application No. 2015-525043, dated Nov. 29, 2016.
(Continued)

*Primary Examiner* — Fernando L Toledo
*Assistant Examiner* — Neil Prasad
(74) *Attorney, Agent, or Firm* — Greenblum & Bernstein, P.L.C.

(57) ABSTRACT

An organic EL element includes: a first electrode that is a metal layer; a transparent conductive layer containing indium zinc oxide; and a light-emitting layer, wherein the first electrode, the transparent conductive layer, and the light-emitting layer are stacked, and a ratio of zinc to indium in a vicinity of an interface of the transparent conductive layer is lower than or equal to 0.25, the interface being closer to the light-emitting layer.

21 Claims, 12 Drawing Sheets

(52) U.S. Cl.
CPC .......... *H01L 51/5215* (2013.01); *H01L 51/56* (2013.01); *H01L 2251/308* (2013.01); *H01L 2251/558* (2013.01)

(56) References Cited

U.S. PATENT DOCUMENTS

| | | | |
|---|---|---|---|
| 2006/0234088 A1* | 10/2006 | Inoue | C04B 35/01 428/702 |
| 2008/0309223 A1* | 12/2008 | Inoue | C04B 35/01 313/504 |
| 2009/0039775 A1* | 2/2009 | Tomai | H01L 51/5218 313/504 |
| 2009/0153032 A1 | 6/2009 | Tomai et al. | |
| 2012/0119643 A1 | 5/2012 | Yamamoto | |
| 2012/0199866 A1* | 8/2012 | Iwanari | C22C 21/00 257/98 |
| 2016/0365541 A1* | 12/2016 | Wehlus | C03C 14/004 |

FOREIGN PATENT DOCUMENTS

| | | |
|---|---|---|
| JP | 2013-114938 | 6/2013 |
| WO | 2007/029457 | 3/2007 |

OTHER PUBLICATIONS

Office Action from Japanese Patent Office in Japanese Application No. 2015-525043, dated Sep. 20, 2016.

* cited by examiner

FIG. 11

| Sample | First electrode 11 | Transparent conductive layer 12 | Baking/UV irradiation |
|---|---|---|---|
| No. 1 | AL alloy | IZO(16 nm) | After forming AL alloy/IZO, bake AL alloy/IZO together at 230°C for 1 hour |
| No. 2 | AL alloy | IZO(5 nm) | After baking only AL alloy at 230°C for 1 hour, form IZO |
| No. 3 | AL alloy | IZO(5 nm) | After forming AL alloy/IZO, bake AL alloy/IZO together at 230°C for 15 minutes |
| No. 4 | AL alloy | IZO(5 nm) | After irradiating only AL alloy with UV, form IZO |
| No. 5 | AL alloy | IZO(5 nm) | After forming AL alloy/IZO, bake AL alloy/IZO together at 230°C for 45 minutes |
| No. 6 | AL alloy | IZO(5 nm) | After forming AL alloy/IZO, bake AL alloy/IZO together at 230°C for 60 minutes |

LIGHT-EMITTING ELEMENT, DISPLAY DEVICE, AND METHOD FOR MANUFACTURING LIGHT-EMITTING ELEMENT

TECHNICAL FIELD

The present disclosure relates to a light-emitting element, a display device including the light-emitting element, and a method for manufacturing the light-emitting element.

BACKGROUND ART

In recent years, research and development on display devices including light-emitting elements such as organic electro-luminescence (EL) elements or on luminaires including the light-emitting elements have been conducted. For example, active-matrix organic EL display devices including the organic EL elements are known (see, for example, Patent Literature (PTL) 1).

CITATION LIST

Patent Literature

[PTL 1] Japanese Unexamined Patent Application Publication No. 2010-27584

SUMMARY OF INVENTION

Technical Problem

However, the conventional techniques have a problem in implementing a light-emitting element having desired characteristics.

Solution to Problem

An aspect of the light-emitting element for solving the problems is a light-emitting element including: a metal layer; a transparent conductive layer containing indium zinc oxide; and a light-emitting layer, wherein the metal layer, the transparent conductive layer, and the light-emitting layer are stacked, and a ratio of zinc to indium in a vicinity of an interface of the transparent conductive layer is lower than or equal to 0.25, the interface being closer to the light-emitting layer.

Furthermore, an aspect of the method for manufacturing a light-emitting element for solving the problems is a method for manufacturing a light-emitting element, the method including: forming a metal layer; forming a transparent conductive layer above the metal layer, the transparent conductive layer containing indium zinc oxide; oxidizing the metal layer; and forming a light-emitting layer above the transparent conductive layer, wherein a ratio of zinc to indium in a vicinity of an interface of the transparent conductive layer is lower than or equal to 0.25, the interface being closer to the light-emitting layer; and

Advantageous Effects of Invention

A light-emitting element and a display device each having desired characteristics can be implemented.

BRIEF DESCRIPTION OF DRAWINGS

FIG. 11 illustrates conditions of six samples of organic EL elements.

DESCRIPTION OF EMBODIMENTS

Figure 1:
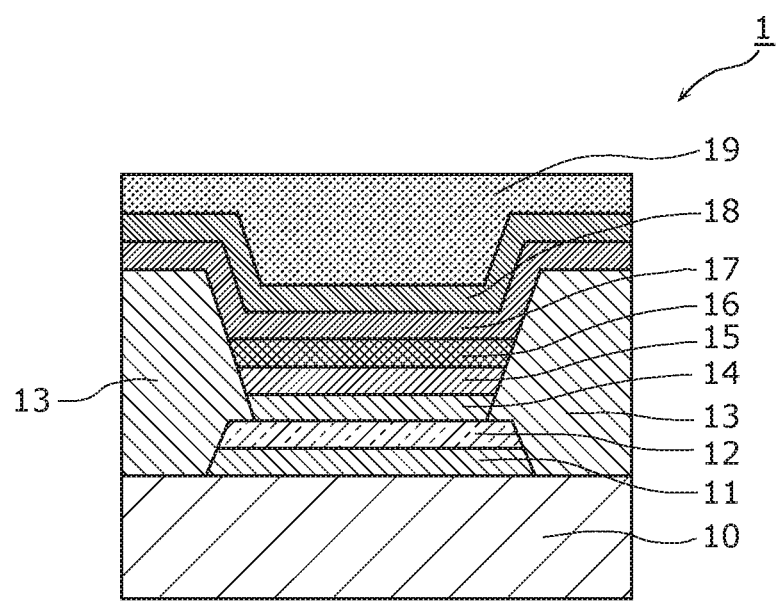
FIG. 1 is a cross sectional view illustrating an organic EL element according to an embodiment.

An embodiment will be described hereinafter with reference to the drawings. The embodiment indicates one of the preferable and specific examples of the present invention. The values, shapes, materials, constituent elements, positions and connections of the constituent elements, processes (steps), and orders of the processes indicated in the embodiment are examples, and do not limit the present invention. The constituent elements in the embodiment that are not described in independent claims that describe the most generic concept of the present invention are described as arbitrary constituent elements.

Furthermore, the drawings are schematic, not necessarily exact. In each of the drawings, the same reference numeral is attached to the constituent element substantially having the same structure, and the overlapping description is omitted or simplified.

An organic EL element will be described as an example of a light-emitting element according to the embodiment. Furthermore, an organic EL display device will be described as an example of a display device.

(Organic EL Element)

First, a structure of an organic EL element 1 according to the embodiment will be described with reference to FIG. 1. FIG. 1 is a cross sectional view illustrating the organic EL element according to an embodiment.

As illustrated in FIG. 1, the organic EL element 1 includes (i) a substrate 10 and (ii) a first electrode (metal layer) 11, a transparent conductive layer 12, a hole injection layer 14, an electron block layer 15, a light-emitting layer 16, an electron injection layer 17, a second electrode 18, and a sealing layer 19 that are sequentially stacked on the substrate 10. The organic EL element 1 according to the embodiment is a top-emission type EL element, and emits electroluminescent light opposite to the substrate 10 (upward in the paper). Although not illustrated, a transparent substrate such as a glass substrate may be formed on the sealing layer 19.

The substrate 10 is, for example, a transparent substrate. For example, a transparent substrate containing a glass or a transparent resin can be used as the substrate 10. Furthermore, a flexible substrate made of a resin can be used as the substrate 10. The substrate 10 can be prepared from, for example, soda glasses, non-fluorescent glasses, phosphate glasses, borate glasses, quartz, acrylic resins, styrene resins, polycarbonate resins, epoxy resins, polyethylene, polyester, silicone resins, or insulating materials such as alumina.

The substrate 10 is not necessarily translucent, and can be non-translucent, such as a silicon substrate when the organic EL element 1 is of a top-emission type as according to the embodiment. When the organic EL element 1 is included in an organic EL display device, the substrate 10 is structured as a thin film transistor (TFT) substrate including TFTs.

The first electrode 11 is formed into a predetermined shape on the substrate 10. The first electrode (lower electrode) 11 is a reflecting electrode having optical reflectivity, and has a function of reflecting light generated by the light-emitting layer 16.

The first electrode 11 is, for example, a metal layer containing aluminum such as an aluminum alloy. The first electrode 11 mainly contains aluminum, and may contain, for example, lanthanum or cobalt. The metallic elements contained in the first electrode 11 are not limited to aluminum but may be any as long as they are lower in ionization energy than those of the metallic oxide of the transparent conductive layer 12. Since the transparent conductive layer 12 according to the embodiment contains an indium zinc oxide (IZO), the metallic elements contained in the first electrode 11 may be any as long as they are lower in ionization energy than those of zinc (Zn).

Furthermore, since the first electrode 11 according to the embodiment is an anode, an electron hole (hole) is injected from the first electrode 11 to the hole injection layer 14 with application of a voltage between the first electrode 11 and the second electrode 18.

The transparent conductive layer 12 is stacked on the first electrode 11. The transparent conductive layer 12 is disposed between the first electrode 11 and the hole injection layer 14, and has both functions of improving the junction between the layers and protecting the first electrode 11 from damages in patterning the first electrode 11 by photolithography. The transparent conductive layer 12 is patterned simultaneously with the first electrode 11. Thus, the transparent conductive layer 12 is almost identical in shape to the first electrode 11 in the planar view.

The transparent conductive layer 12 is a transparent conductive film containing IZO. The transparent conductive layer 12 is, for example, a single film of IZO (IZO film).

Only the first electrode 11 may be called an anode, or a stack of the first electrode 11 and the transparent conductive layer 12 may be called an anode. In the latter case, the first electrode 11 is a lower anode, and the transparent conductive layer 12 is an upper anode. In an active-matrix display device, each of the first electrodes 11 and the transparent conductive layers 12 is formed like an island and these are formed into a matrix, whereas in an passive-matrix display device, several arrays of the first electrodes 11 and the transparent conductive layers 12 are formed in row and column directions.

A bank 13 is a partition for surrounding the light-emitting layers 16, and has openings for forming the light-emitting layers 16. For example, in a display device including the light-emitting layers 16, each of the light-emitting layers 16 is in a region partitioned by the bank 13. Here, the bank 13 defines a unit pixel (sub-pixel).

The bank 13 contains, for example, an organic material such as a resin, or an inorganic material such as a glass. Examples of the organic material include acrylic resins, polyimide resins, and novolac type phenolic resins. Furthermore, examples of the inorganic material include silicon oxide ($SiO_2$) and silicon nitride ($Si_3N_4$). The bank 13 suitably contains a material that is organic solvent-tolerant and has insulating properties. Furthermore, the bank 13 suitably contains a material tolerant of, for example, etching and baking because it is sometimes etched and baked.

In the region defined by the bank 13, the first electrode 11, the transparent conductive layer 12, the hole injection layer 14, and the light-emitting layer 16 are stacked in this order. In a display device including the organic EL element 1, the first electrodes 11, the transparent conductive layers 12, the hole injection layers 14, and the light-emitting layers 16 are separated into regions by the bank 13. However, when there is no need to separate the first electrodes 11, the transparent conductive layers 12, the hole injection layers 14, and the light-emitting layers 16 into regions in the display device, the bank 13 does not have to be included in the display device.

The hole injection layer (HIL) 14 is formed above the first electrode 11 to be surrounded by the bank 13. The hole injection layer 14 is disposed between the first electrode 11 (the transparent conductive layer 12) and the light-emitting layer 16, and has a function of injecting holes into the light-emitting layer 16. The ionization energy of the hole injection layer 14 is selected to be between a work function of the first electrode 11 and the ionization energy of the light-emitting layer 16.

The hole injection layer 14 contains, for example, organic materials such as phthalocyanines, oligoamines, dendrimer amines, and polythiophenes, or inorganic materials containing, for example, a metallic oxide, such as a tungsten oxide film. The hole injection layer 14 according to the embodiment contains the organic amines.

The electron block layer (IL) 15 is formed on the hole injection layer 14. The electron block layer 15 inhibits the electrons injected from the electron injection layer 17 from reaching the hole injection layer 14. The ionization energy of the electron block layer 15 is higher than that of the light-emitting layer 16. The electron block layer 15 contains, for example, a polymeric organic material.

The light-emitting layer 16 (EML) is a layer between the first electrode 11 and the second electrode 18, and has a function of emitting light by excitation of a light-emitting material through energy caused by recombination of the injected electrons and holes with application of a predetermined voltage between the first electrode 11 and the second electrode 18. In FIG. 1, the light-emitting layer 16 is sandwiched between the electron block layer 15 and the electron injection layer 17. Furthermore, the light-emitting layer 16 can emit light of a predetermined color (wavelength) according to a material to be selected. For example, the light-emitting layer 16 in a display device can be one of a red light-emitting layer that emits red light, a green light-emitting layer that emits green light, and a blue light-emitting layer that emits blue light. Furthermore, the light-emitting layer 16 in a luminaire can be a light-emitting layer that emits white light.

The light-emitting layer 16 is an organic light-emitting layer containing, for example, an organic material that may be any of a low-molecular organic material and a high-molecular organic material. The light-emitting layer 16 contains, for example, poly(9,9-di-n-octyl-fluorene-alt-benzothiadiazole) (F8BT) that is a high-molecular organic material. The light-emitting layer 16 may contain, not limited to this material, but other known organic materials. Examples of the known organic materials include oxinoid compounds, perylene compounds, coumarin compounds, azakumarin compounds, oxazole compounds, oxadiazole compounds, perynone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazololine derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, teruropiririumu compounds, aromatic arudajien compounds, oligophenylene compounds, thioxanthen compounds, cyanine compounds, acridine compounds, metal complexes of 8-hydroxyquinoline compounds, metal complexes of 2-bipyridine compounds, complexes of Schiff bases and group III metals, oxine metal complexes, and phosphors such as rare earth complexes.

The electron block layer (EIL) 17 is formed on the light-emitting layer 16. The electron block layer 17 according to the embodiment is formed to cover the light-emitting layers 16 and the bank 13. In other words, the electron block layer 17 is formed continuous with the adjacent sub-pixels over the regions defined by the bank 13. For example, the electron block layer 17 may be formed to cover all the sub-pixels.

The electron block layer 17 is disposed between the second electrode 18 and the light-emitting layer 16, and has a function of injecting electrons into the light-emitting layer 16. The electron affinity of the electron block layer 17 is selected to be between the work function of the second electrode 18 and the electron affinity of the light-emitting layer 16. The electron block layer 17 contains, for example, organic materials such as metal chelates, phenanthrolines, oxadiazoles, and triazoles, or inorganic materials such as alkali metal compounds and alkaline earth metal compounds. Examples of the inorganic materials include barium, phthalocyanine, and lithium fluoride, and mixtures of these materials.

The second electrode 18 (upper electrode) is formed on the electron block layer 17 to face the first electrode 11. The second electrode 18 according to the embodiment is formed to cover the light-emitting layers 16 and the bank 13 as the electron block layer 17 does, for example, to cover all the sub-pixels.

When the organic EL element 1 is of a top-emission type, the second electrode 18 contains a material that is optically transparent. The second electrode 18 is, for example, a transparent conductive layer (transparent electrode) containing a transparent metal oxide, such as indium tin oxide (ITO) or IZO. Furthermore, the second electrode 18 does not necessarily contain a material that is transparent per se, but may be structured to allow light to pass by reducing the thickness of the metal film, such as a film of silver (Ag) or aluminum (Al). Furthermore, the second electrode 18 may be a stack of films selected from these transparent metal oxides and the metal films.

Furthermore, since the second electrode 18 according to the embodiment is a cathode, electrons are injected from the second electrode 18 to the electron block layer 17 with application of a voltage between the first electrode 11 and the second electrode 18.

The sealing layer 19 is formed to cover the second electrode 18. The sealing layer 19 has a function of preventing the organic layers such as the light-emitting layer 16 from being exposed to water or air. Thus, the sealing layer 19 is not necessarily required but may be preferred.

The sealing layer 19 can contain an organic or inorganic insulating material. The sealing layer 19 may contain, for example, organic materials such as fluororesins, or inorganic materials such as oxides including silicon oxide ($SiO_2$), germanium oxide (GeO), and aluminum oxide ($Al_2O_3$) and nitrides including silicon oxynitride (SiON) and silicon nitride (SiN). Furthermore, the sealing layer 19 may be a stack of materials of different kinds. When the organic EL element 1 is of a top-emission type, the sealing layer 19 contains a material that is optically transparent.

In the organic EL element 1 structured as above, a ratio of zinc to indium in a surface layer of the transparent conductive layer 12 (in the vicinity of the interface of the transparent conductive layer 12 that is closer to the light-emitting layer 16) is lower than or equal to 0.25.

Although the hole injection layer 14, the electron block layer 15, and the electron injection layer 17 are provided as functional layers between the first electrode 11 and the second electrode 18, these layers are not necessarily required but may be combined with, for example, a hole transport layer, a hole blocking layer, and an electron transport layer as appropriate to form the functional layers.

Furthermore, on the sealing layer 19, a transparent substrate such as a glass substrate may be disposed through an adhesive layer, or a transparent substrate on which an RGB color filter is formed (color filter substrate) may be disposed in a display device.

(Organic EL Display Device)

Figure 2:
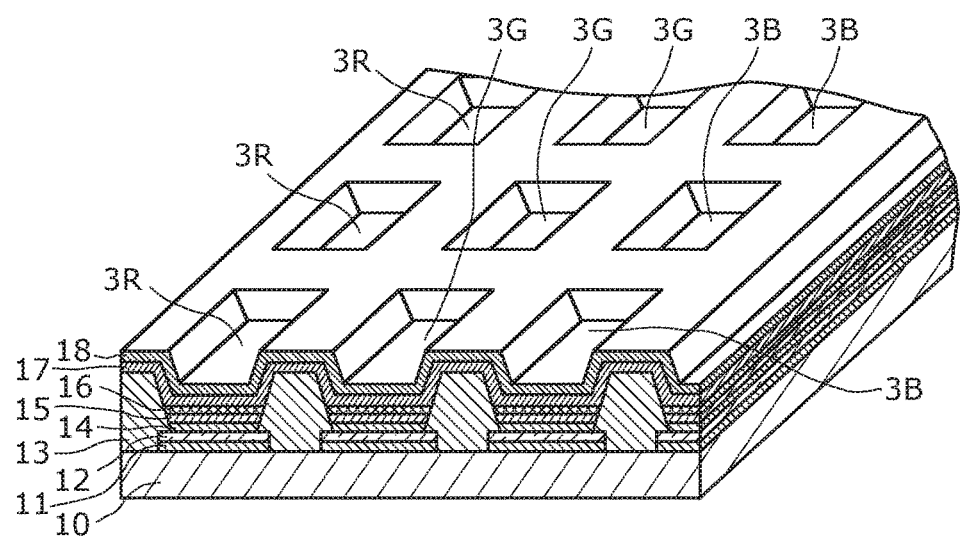
FIG. 2 is a perspective cross sectional view illustrating an organic EL display device according to an embodiment.

Next, a structure of an organic EL display device 2 including the organic EL elements 1 will be described with reference to FIG. 2. FIG. 2 is a perspective cross sectional view illustrating the organic EL display device according to the embodiment.

As illustrated in FIG. 2, the organic EL display device 2 has a structure in which, on a planarization layer formed in the substrate (TFT substrate) 10, the first electrodes 11, the transparent conductive layers 12, the hole injection layers 14, the electron block layers 15, the light-emitting layers 16, the electron injection layer 17, and the second electrode 18 are sequentially formed. FIG. 2 omits the sealing layer 19.

In the organic EL display device 2, the bank 13 defines the unit pixels, and each of the unit pixels includes sub-pixels of three colors (red, green, and blue), namely, sub-pixels 3R, 3G, and 3B. These sub-pixels 3R, 3G, and 3B are arranged in a matrix, and are mutually separated by the bank 13. The sub-pixels 3R, 3G, and 3B include the light-emitting layer 16 that emits red light (a red light-emitting layer), the light-emitting layer 16 that emits green light (green light-emitting layer), and the light-emitting layer 16 that emits blue light (a blue light-emitting layer), respectively.

The bank 13 in FIG. 2 is a pixel bank, and surrounds each of the light-emitting layers 16 in a corresponding sub-pixel. The bank 13 may be not a pixel bank but line banks. When the banks 13 are the line banks, the banks 13 partition pixels on a per column or row basis, and exist only along the light-emitting layers 16 in a column or row direction. Accordingly, the light-emitting layers 16 are aligned in the column or row direction.

Furthermore, although not illustrated, when the organic EL display device 2 is an active-matrix display device, gate lines (scanning lines) that are formed in a row direction, source lines (signal lines) that cross the gate lines and are formed in a column direction, and power lines that are disposed parallel to the source lines are formed on the substrate 10 that is an TFT substrate. Each of the unit pixels is partitioned by, for example, a gate line and a source line that are orthogonal to each other. Here, the bank 13 is formed in a grid pattern so that ridges extending parallel to the gate lines cross ridges extending parallel to the source lines.

Furthermore, each of the unit pixels includes a switching transistor (TFT) functioning as a switching element, and a driving transistor functioning as a driving element. The gate lines are connected to respective gate electrodes of the switching transistors in the unit pixels in each of the lines, whereas source lines are connected to respective source electrodes of the switching transistors in the unit pixels in each of the lines. Furthermore, the power lines are connected to respective drain electrodes of the driving transistors for each of the columns.

(Method for Manufacturing Organic EL Element)

Figure 3:
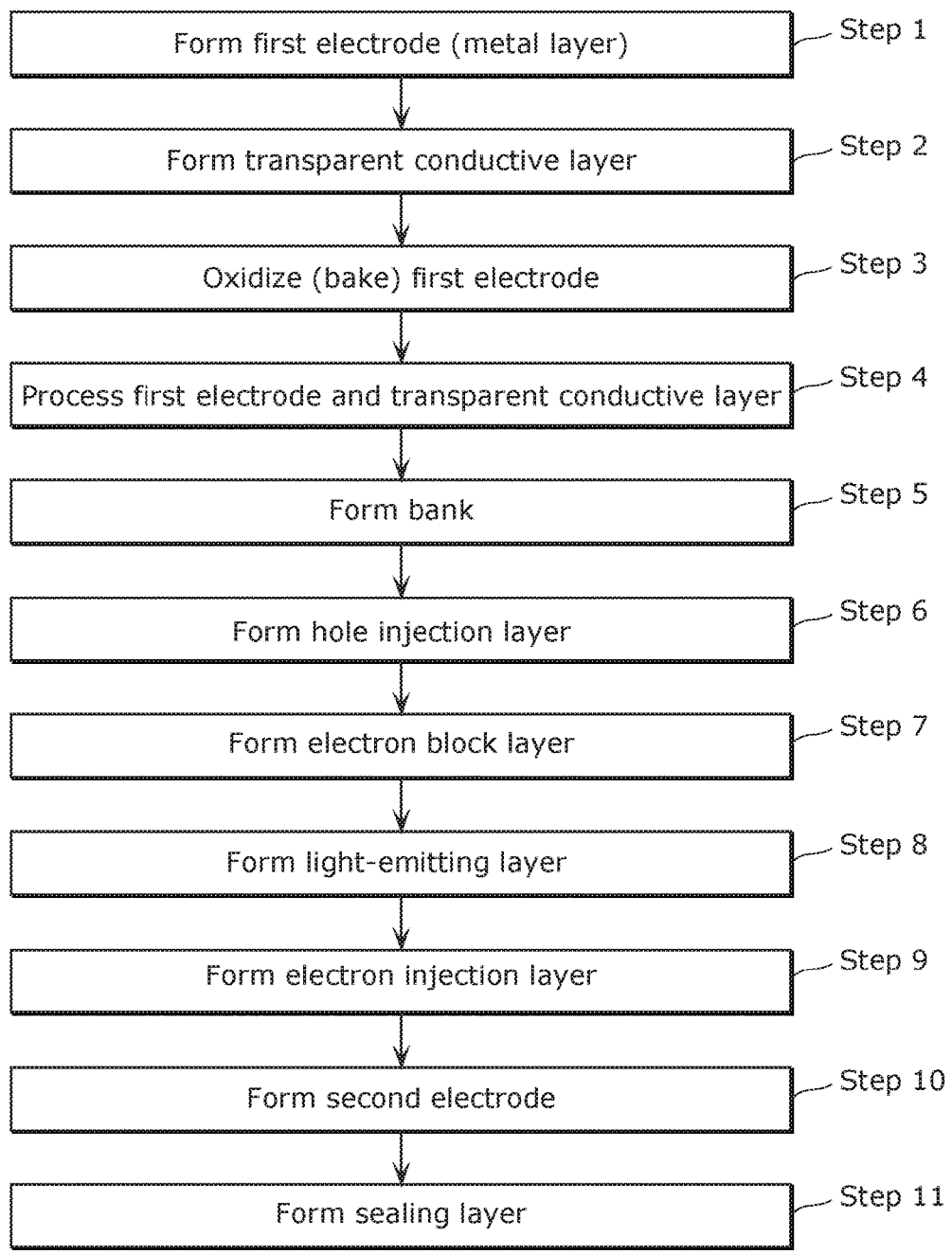
FIG. 3 is a flowchart for manufacturing an organic EL element according to an embodiment.

Next, a method for manufacturing the organic EL element 1 will be described with reference to FIGS. 3 to 7. FIG. 3 is a flowchart for manufacturing the organic EL element according to the embodiment. FIGS. 4 to 7 are process cross sectional views illustrating the method for manufacturing the organic EL element according to the embodiment.

As illustrated in FIG. 3, the method for manufacturing the organic EL element 1 include as an example: forming the first electrode 11 (Step 1); forming the transparent conductive layer 12 (Step 2); oxidizing the first electrode 11 (Step 3); processing the first electrode 11 and the transparent conductive layer 12 (Step 4); forming the bank 13 (Step 5); forming the hole injection layer 14 (Step 6); forming the electron block layer 15 (Step 7); forming the light-emitting layer 16 (Step 8); forming the electron injection layer 17 (Step 9); forming the second electrode 18 (Step 10); and forming the sealing layer 19 (Step 11).

The organic EL element 1 is prepared through the processes from Step 1 to Step 11. Each of the processes will be described in detail.

Figure 4:
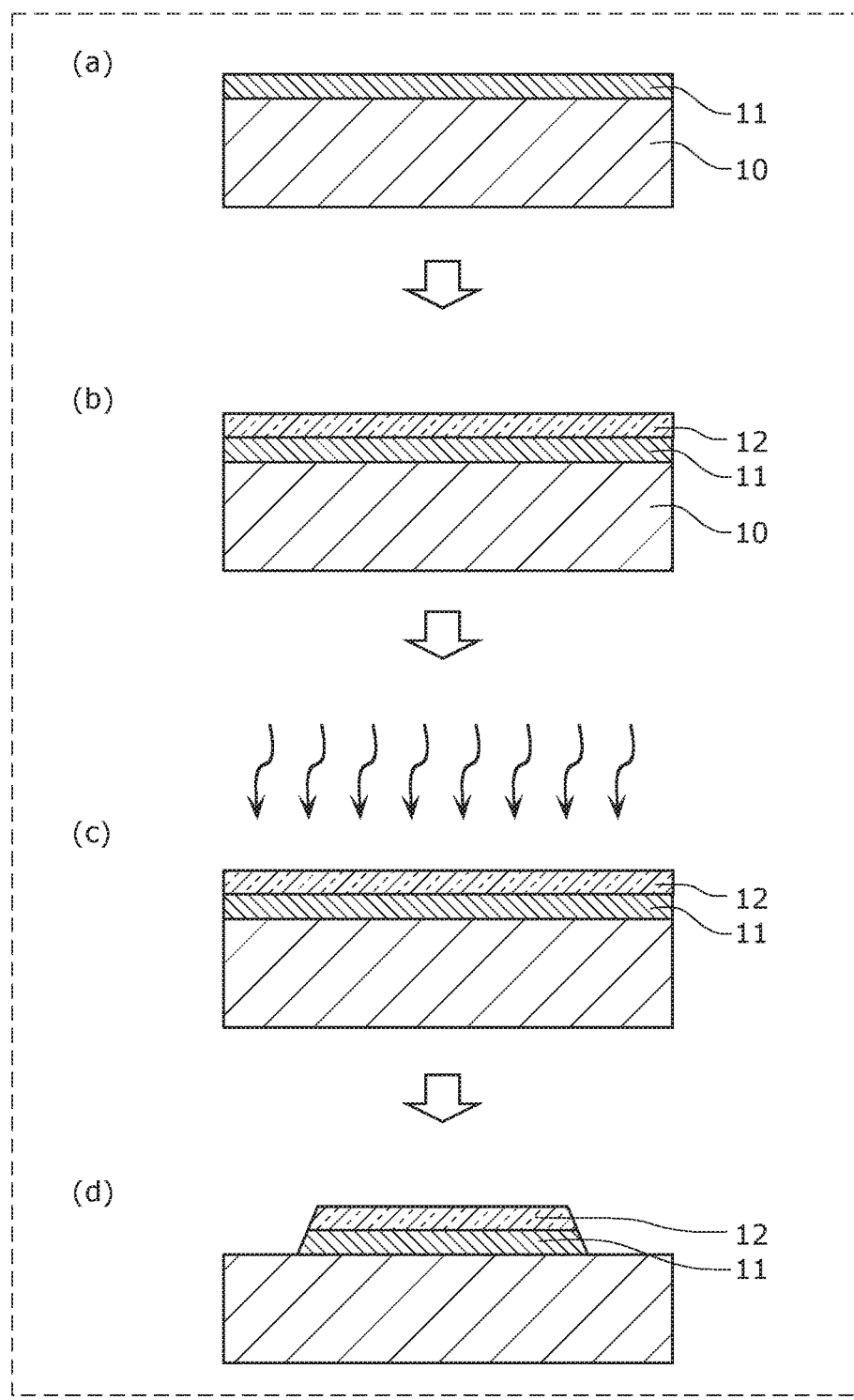
FIG. 4 illustrates process cross sectional views of a method for manufacturing an organic EL element according to an embodiment.

First, at the forming of the first electrode 11 (Step 1), a metal layer containing aluminum is formed as the first electrode 11 on the substrate 10 such as a glass substrate, by, for example, sputtering as illustrated in (a) of FIG. 4. The first electrode 11 may be formed by, for example, vacuum deposition.

Next, at the forming of the transparent conductive layer 12 (Step 2), an IZO film is formed as the transparent conductive layer 12 on the first electrode 11 by, for example, sputtering as illustrated in (b) of FIG. 4.

Next, at the oxidizing of the first electrode 11 (Step 3), the first electrode 11 is baked at a predetermined temperature for a predetermined duration to reduce the sheet resistance of the first electrode 11 as illustrated in (c) of FIG. 4. The oxidation of the first electrode 11 in advance can suppress the oxidation-reduction reaction with the transparent conductive layer 12. Since the transparent conductive layer 12 is formed on the first electrode 11 before the baking, the first electrode 11 and the transparent conductive layer 12 are baked together.

Next, at the processing of the first electrode 11 and the transparent conductive layer 12 (Step 4), a stack of the first electrode 11 and the transparent conductive layer 12 is patterned by photolithography to form the first electrode 11 and the transparent conductive layer 12 of a predetermined shape as illustrated in (d) of FIG. 4. For example, the first electrodes 11 and the transparent conductive layers 12 are formed like islands.

Figure 5:
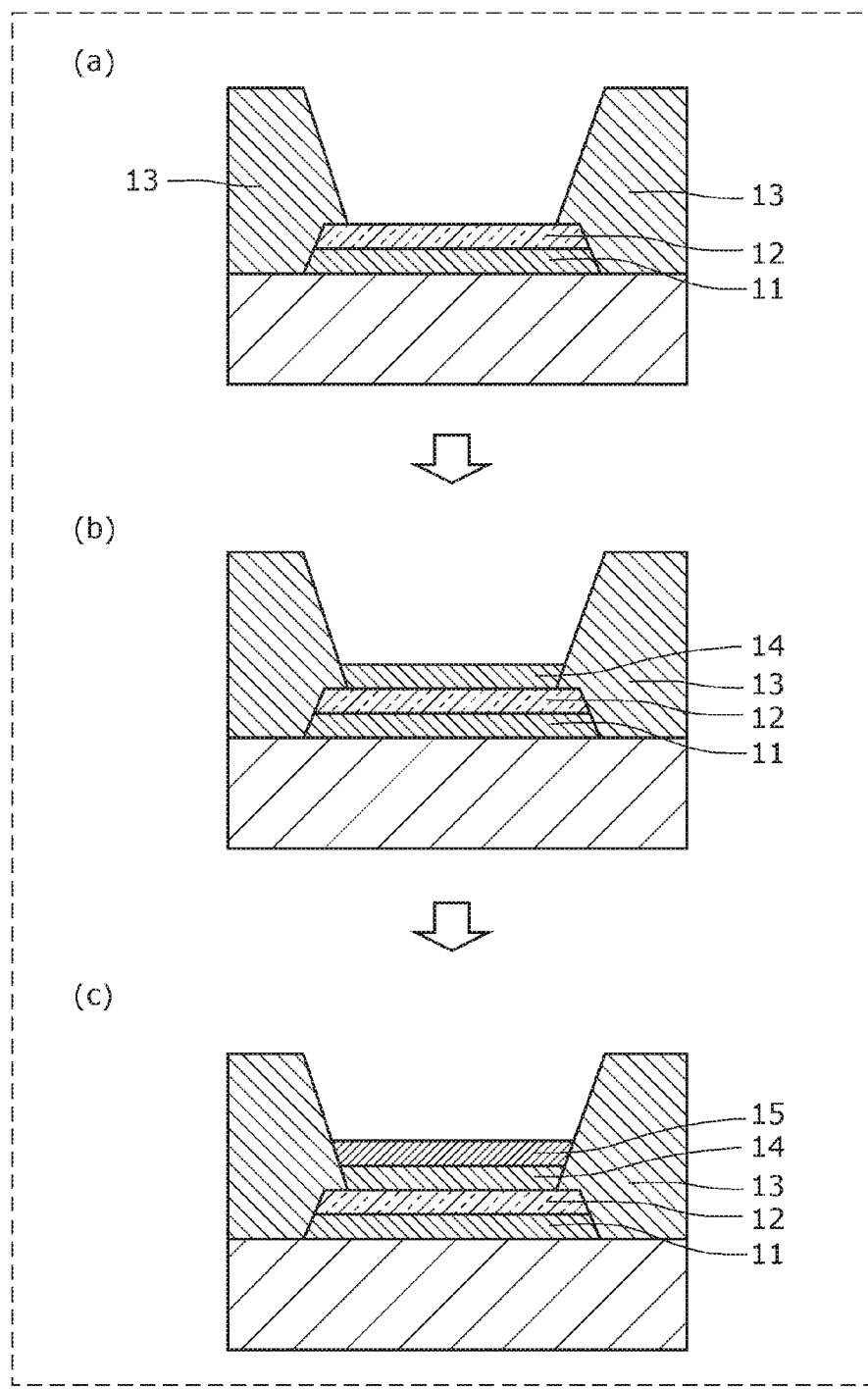
FIG. 5 illustrates process cross sectional views of a method for manufacturing an organic EL element according to an embodiment.

Next, at the forming of the bank 13 (Step 5), the bank 13 is formed, for example, to surround the regions (sub-pixel regions) in each of which the first electrode 11 and the transparent conductive layer 12 are patterned, as illustrated in (a) of FIG. 5. The bank 13 can be formed by photolithography.

Specifically, the bank 13 is patterned by, for example, applying a photoresist film containing a photoresist material (for example, a photosensitive resin) to the transparent conductive layer 12, exposing the photoresist film to light through a mask, removing a desired portion of the photoresist film by processing the photoresist film using a developer to open the photoresist film, and then patterning the bank 13 by heating (for example, baking).

The bank 13 can be formed from an inorganic material by, for example, chemical-vapor deposition (CVD). Furthermore, a water repellent may be applied to the surface of the bank 13 as necessary.

Next, at the forming of the hole injection layer 14 (Step 6), the hole injection layer 14 can be formed by, for example, applying an organic material (ink) for the hole injection layer 14 on the transparent conductive layer 12 in the region defined by the bank 13 (opening portion of the bank 13) by inkjet method, and drying the hole injection layer 14 as illustrated in (b) of FIG. 5. For example, an organic amine is used as the material for the hole injection layer 14.

The organic material (ink) for the hole injection layer 14 may be applied by, for example, a dispenser method, a nozzle coating method, a spin coating method, intaglio printing, and letterpress printing. Furthermore, when the hole injection layer 14 contains an inorganic material, the forming of the hole injection layer 14 may be performed between the forming of the transparent conductive layer 12 and the forming of the bank 13. Here, the hole injection layer 14 does not have to be surrounded by the bank 13.

Next, at the forming of the electron block layer 15 (Step 7), the electron block layer 15 is formed by, for example, applying an organic material (ink) for the electron block layer 15 on the hole injection layer 14 in the region defined by the bank 13 by inkjet method, and drying the electron block layer 15 as illustrated in (c) of FIG. 5.

For example, an amine polymer is used as the material for the electron block layer 15. The amine polymer is used as an ink for printing by being dispersed into a solvent.

The organic material (ink) for the electron block layer 15 may be applied by, for example, a dispenser method, a nozzle coating method, a spin coating method, intaglio printing, and letterpress printing.

Figure 6:
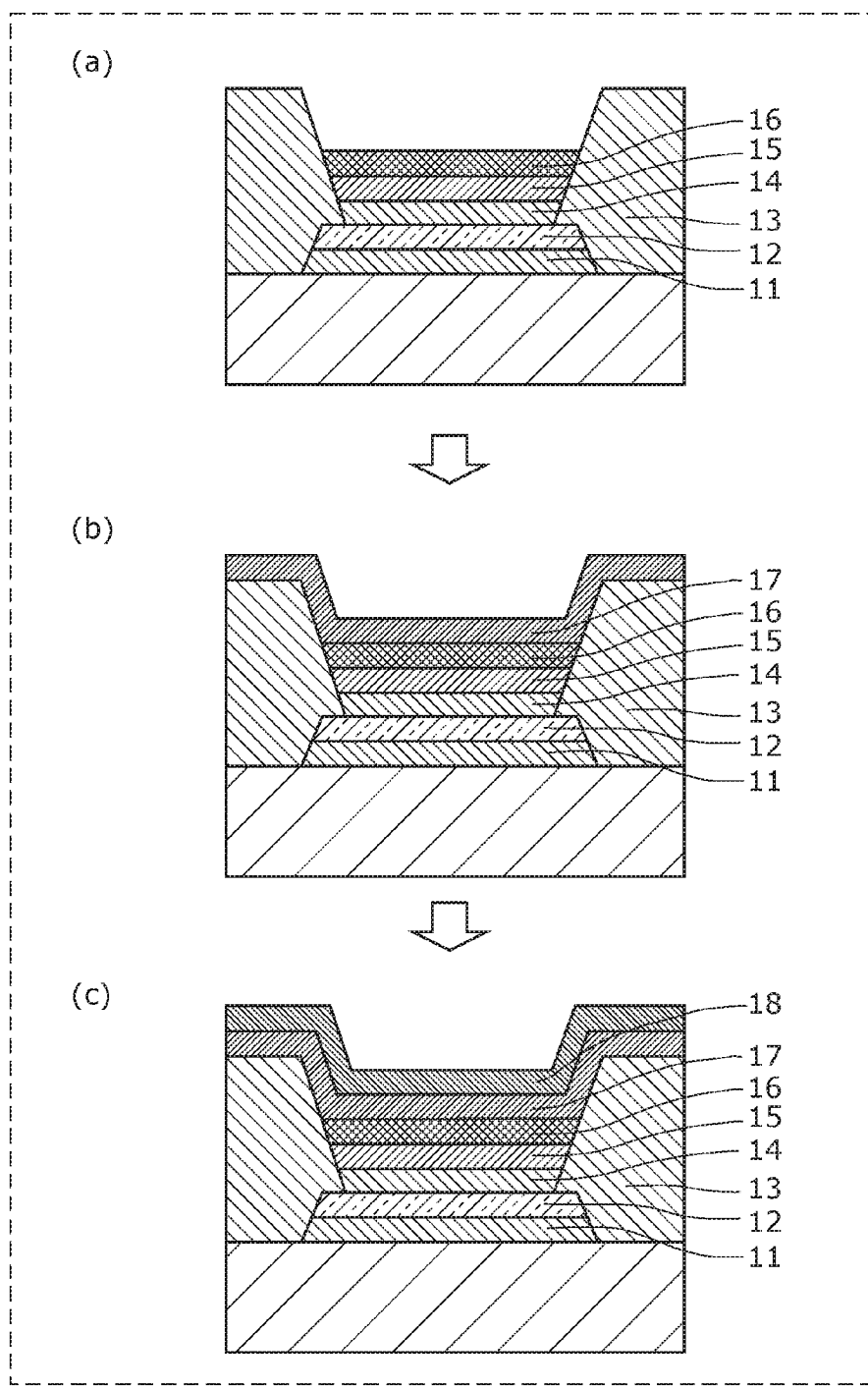
FIG. 6 illustrates process cross sectional views of a method for manufacturing an organic EL element according to an embodiment.

Next, at the forming of the light-emitting layer 16 (Step 8), the light-emitting layer 16 can be formed by, for example, applying an organic material (ink) for the light-emitting layer 16 on the electron block layer 15 in the region defined by the bank 13 by inkjet method, and drying the light-emitting layer 16 as illustrated in (a) of FIG. 6.

The organic material (ink) for the light-emitting layer 16 may be applied by, for example, a dispenser method, a nozzle coating method, a spin coating method, intaglio printing, and letterpress printing. Furthermore, in a display device, the organic material for the light-emitting layers 16 is separately applied to each of the red light-emitting layer, the green light-emitting layer, and the blue light-emitting layer. An ink-jet device including heads can simultaneously apply the organic material to the red light-emitting layer, the green light-emitting layer, and the blue light-emitting layer.

Next, at the forming of the electron injection layer 17 (Step 9), a thin barium film is formed as the electron injection layer 17 on the light-emitting layer 16 by, for example, vacuum deposition as illustrated in (b) of FIG. 6.

>Next, at the forming of the second electrode 18 (Step 10), an ITO film is formed as the second electrode 18 on the electron injection layer 17 by, for example, sputtering as illustrated in (c) of FIG. 6.

Figure 7:
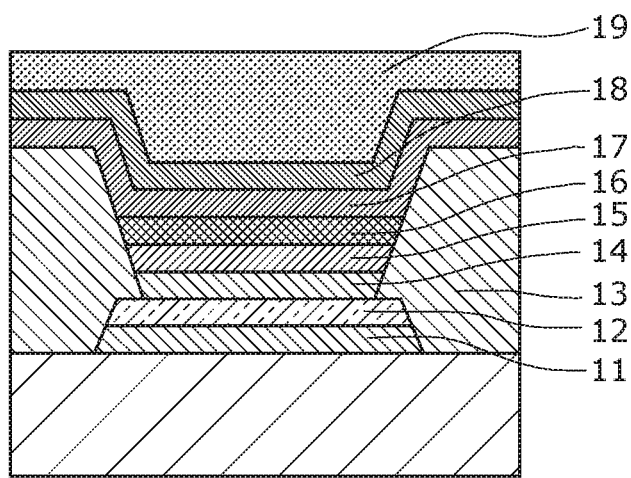
FIG. 7 illustrates a process cross sectional view of a method for manufacturing an organic EL element according to an embodiment.

Next, at the forming of the sealing layer 19 (Step 11), an SiN film is formed as the sealing layer 19 on the second electrode 18 by, for example, plasma CVD as illustrated in FIG. 7.

In the organic EL element 1 manufactured as according to the method above, a ratio of zinc to indium in a surface layer of the transparent conductive layer 12 (in the vicinity of the interface of the transparent conductive layer 12 that is closer to the light-emitting layer 16) is lower than or equal to 0.25.

Figure 8:
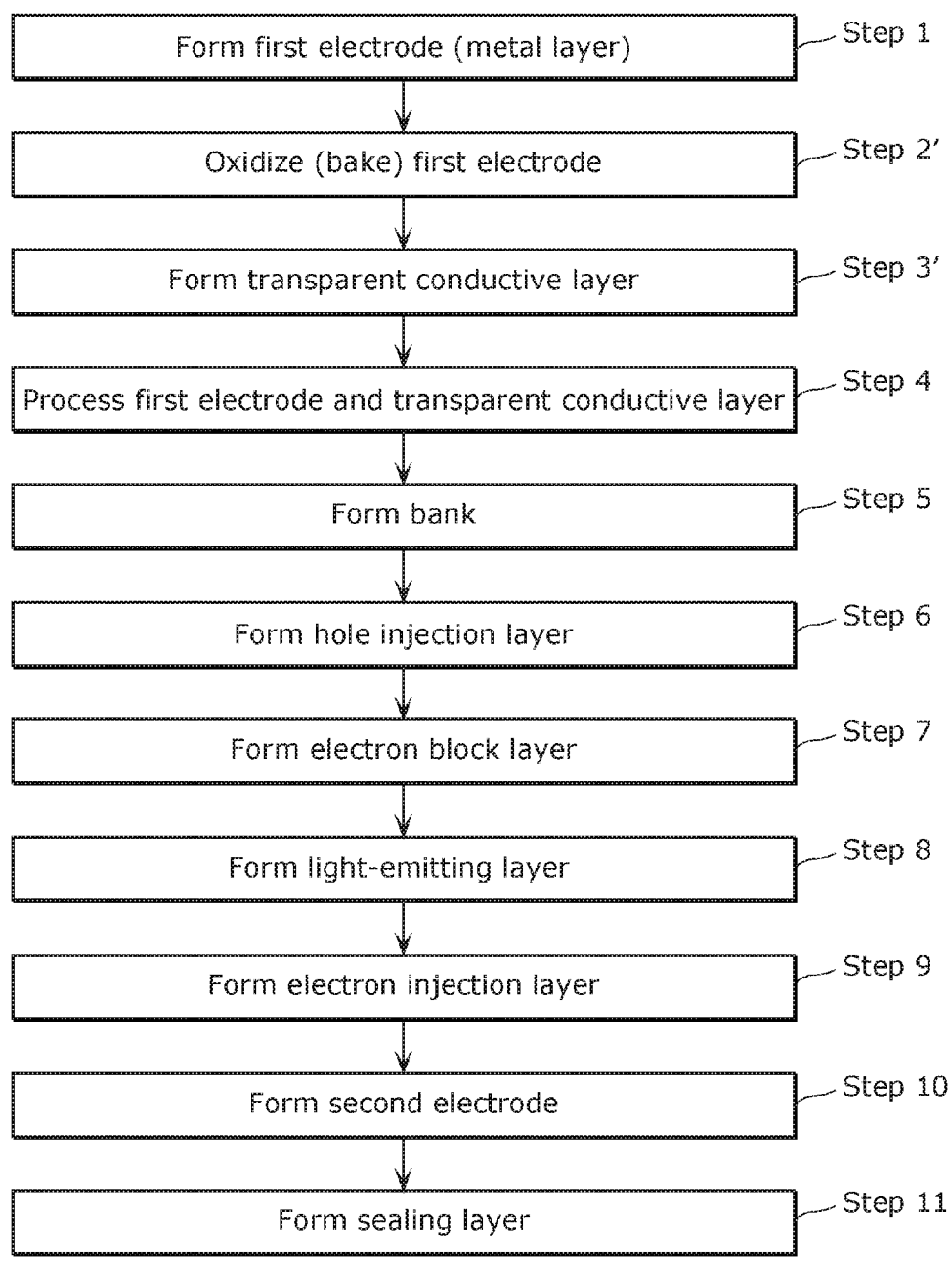
FIG. 8 is a flowchart for manufacturing an organic EL element according to another embodiment.

Although the oxidizing (baking) of the first electrode 11 (metal layer) is performed after the forming of the transparent conductive layer 12 in the manufacturing method, it may be performed before the forming of the transparent conductive layer 12 as illustrated in FIG. 8. In other words, oxidizing (baking) of the first electrode 11 (metal layer) (Step 2') may be performed between the forming of the first electrode 11 (Step 1) and forming of the transparent conductive layer 12 (Step 3'). Here, only the first electrode 11 can be baked and oxidized.

Furthermore, in the manufacturing processes in FIGS. 3 and 8, irradiating the first electrode 11 with ultraviolet rays (UV) may be performed as the oxidizing of the first electrode 11. The first electrode 11 can be oxidized even by irradiating the first electrode 11 with ultraviolet rays, thus reducing the sheet resistance of the first electrode 11.

(Advantages)

The advantages of the organic EL element 1 will be described with the circumstances of how the Inventors have arrived at the techniques of the present disclosure.

Figure 9:
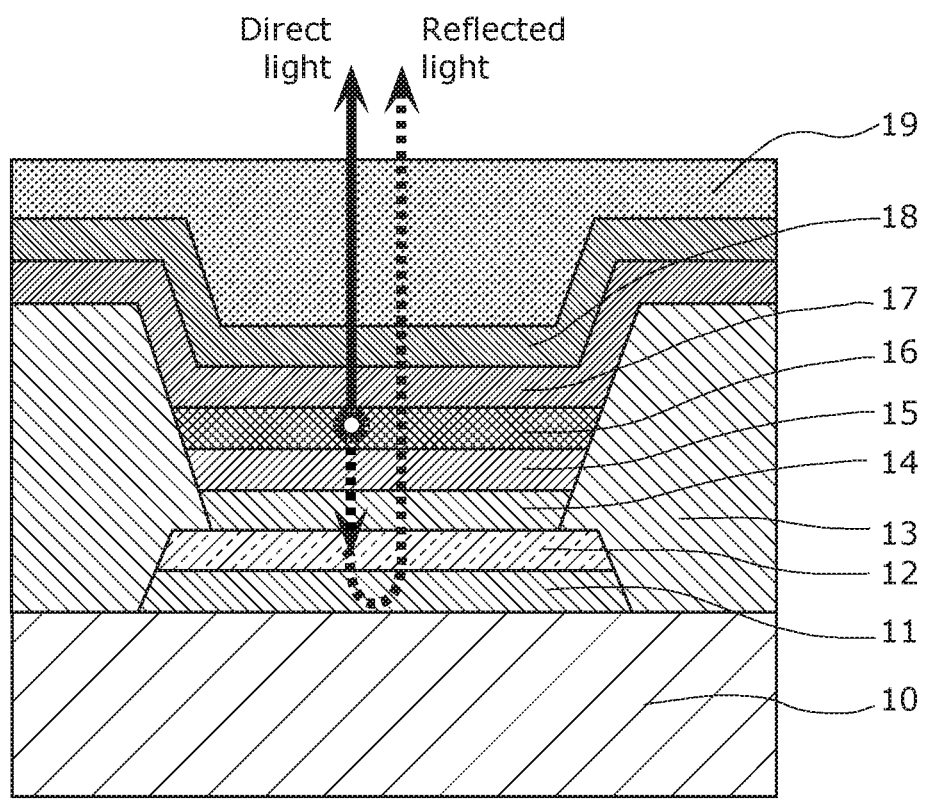
FIG. 9 illustrates light paths when an organic EL element emits light.

In the top-emission type organic EL element in FIG. 9, the light-emitting layer 16 emits light with application of a voltage (driving voltage) between the first electrode 11 and the second electrode 18. A portion of the light travels directly upward as direct light. Another portion of the light temporarily travels downward, is reflected off the first electrode 11, and then travels upward as reflected light.

For example, when an organic EL element emits blue light, the user views the blue light in which the direct light and the reflected light interfere with each other. It is desirable that the blue-light-emitting organic EL element emits deeper blue light by reducing a y-value, that is, a by-value (a y-value of blue) or by setting a lower by-value, in an x-y chromaticity diagram of CIE XYZ colorimetric system. In a display device such as a TV, the blue-light-emitting organic EL elements that emit deeper blue light easily achieve a desired wider color gamut without any color filter. Furthermore, when the display device includes a color filter, the color filter needs to be the one through which a lower by-value easily passes to have a wider color gamut.

The blue light emitted from the blue-light-emitting organic EL element may be deepened by, for example, thinning the transparent conductive layer 12 to negate the long-wavelength components to some extent through suppressing the interference between the direct light and the reflected light.

Focusing on differences in light path length between the direct light and the reflected light, the light path length of the reflected light is longer than that of the direct light by a round trip between three layers of the electron block layer 15, the hole injection layer 14, and the transparent conductive layer 12 as illustrated in FIG. 9. Here, thinning the three layers may reduce the wavelength light of blue light in a long-wavelength region (for example, 460 nm of the center wavelength) to the light with a lower by-value to enable the organic EL element 1 to emit deeper blue light.

However, there is a limit to the processes of thinning the hole injection layer 14 and the electron block layer 15. For example, since the hole injection layer 14 and the electron block layer 15 are formed from organic materials by a coating method (printing), the maximum thickness of the hole injection layer 14 is 15 nm, whereas the maximum thickness of the electron block layer 15 is 10 nm.

Here, thinning the transparent conductive layer 12 may enable the organic EL element 1 to emit deeper blue light. The transparent conductive layer 12 can be made thinner than the hole injection layer 14 and the electron block layer 15, that is, 5 nm or less in thickness.

Figure 10:
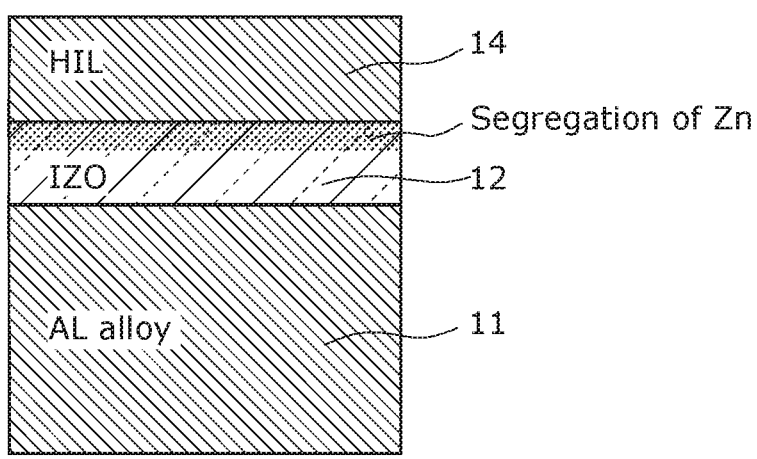
FIG. 10 schematically illustrates a state of Zn segregated in a surface layer of a transparent conductive layer in an organic EL element.

However, the Inventors of the present application found that thinning the transparent conductive layer 12 that is an IZO film may increase the driving voltage of the organic EL element. Specifically, the Inventors have found that, through their earnest study on this reason, Zn atoms segregate in a surface layer of the transparent conductive layer 12 by oxidizing the stacked structure of the first electrode 11 that is an aluminum alloy, the transparent conductive layer 12, and the hole injection layer 14 as illustrated in FIG. 10. X-ray photoelectron spectroscopy (XPS) verified the actual segregation of Zn atoms in the IZO film.

From the study on the reason why Zn atoms segregate in the surface layer of the IZO film, the Inventors have found that the Zn atoms were liberated from the IZO film. Specifically, the oxidizing includes baking the first electrode 11 after stacking the transparent conductive layer 12 on the first electrode 11. It was clarified that the reason is that during this process, Zn atoms separate through redox reactions of aluminum contained in the first electrode 11 and IZO contained in the transparent conductive layer 12, and are liberated even in the vicinity of the interface between the transparent conductive layer 12 and the first electrode 11. In other words, it was clarified that oxygen (O) in IZO was consumed by oxidation reaction of aluminum (Al).

Once a Zn segregation layer is formed in the surface layer of the transparent conductive layer 12 by the segregation of Zn in the vicinity of the interface between the transparent conductive layer 12 and the hole injection layer 14, the junction level at the interface is worsen. In other words, the number of trapped levels increases due to the Zn segregation. As a result, the driving voltage of the organic EL element increases.

In short, the color of light emitted from the organic EL element 1 cannot be deeper (the y-value cannot be reduced) due to the displacement in cavity when the transparent conductive layer 12 is made thicker, whereas the driving voltage of the organic EL element 1 increases when the transparent conductive layer 12 is made thinner.

The technique of the present disclosure has been conceived based on the knowledge above. The Inventors have found that even when the transparent conductive layer 12 is made thinner, increase in the driving voltage of the organic EL element 1 can be suppressed by defining the upper limit of a ratio of zinc (Zn) to indium (In) in the surface layer of the transparent conductive layer 12.

The problem of the organic EL element that emits blue light is described above. Similarly, the organic EL elements that emit red light and green light have a problem in increase in the driving voltage when they are made thinner. Thus, the technique of the present disclosure is effective for the organic EL elements that emit red light and green light. The organic EL display devices including organic EL elements of three RGB colors are designed with respect to blue light whose emission efficiency is the worst of the three colors. Thus, the following will mainly discuss the blue light.

Figure 12:
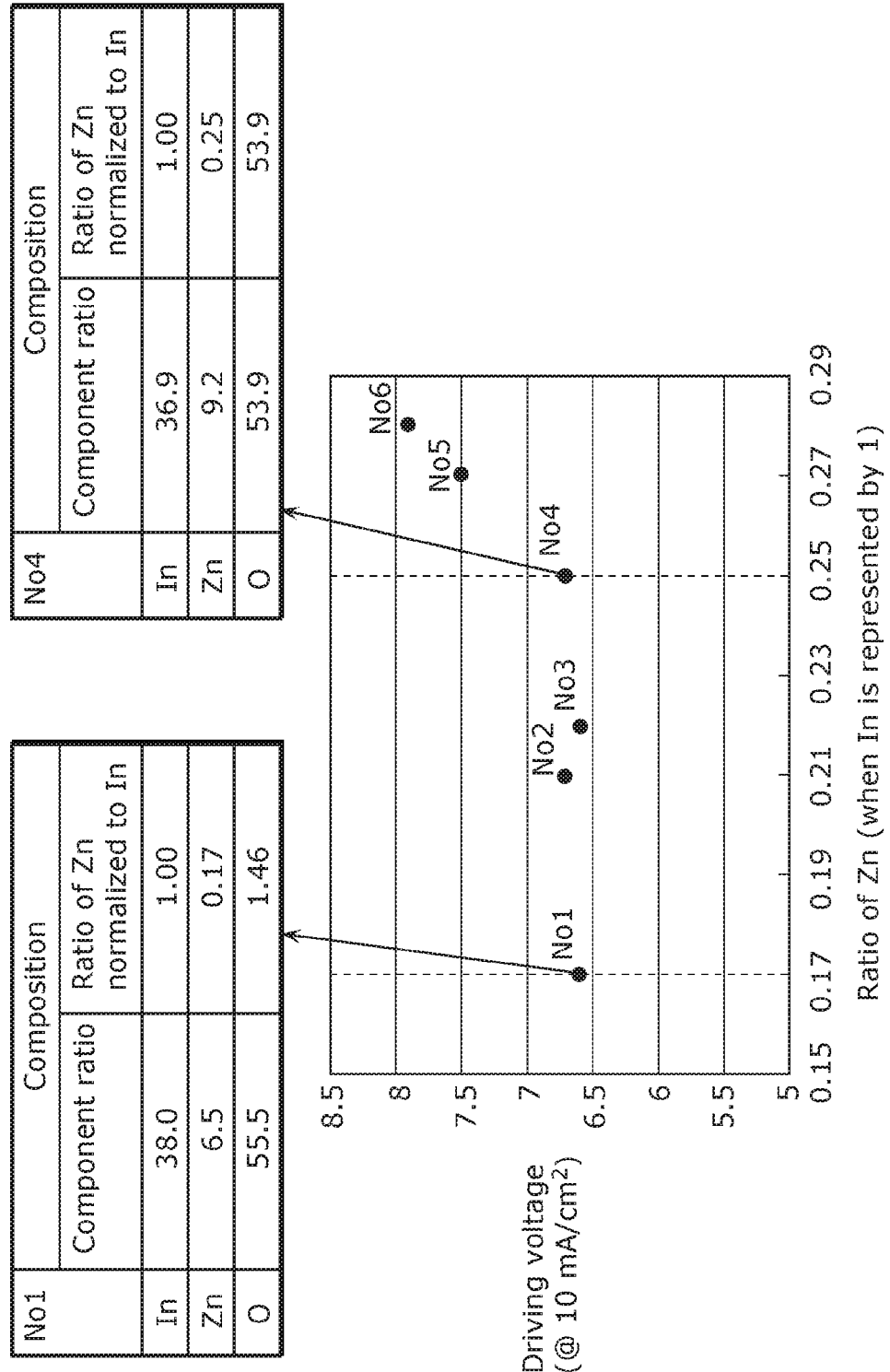
FIG. 12 illustrates relationships between (i) driving voltages of organic EL elements of the six samples prepared under the conditions in FIG. 11 and (ii) ratios of Zn in the transparent conductive layers.

Based on the knowledge, the Inventors of the present application conducted an experiment of preparing six samples of the organic EL elements having the structures illustrated in FIG. 11, measuring and calculating a ratio of Zn to In in the surface layer of the transparent conductive layer 12 from each of the samples, and examining the dependency of the ratio of Zn on the driving voltage of each of the organic EL elements. FIG. 12 illustrates the result of the experiment. The organic EL elements of this experiment have the same structure as that of the organic EL element in FIG. 1. Furthermore, all the aluminum alloys in the samples No. 1 to No. 6 have the thickness of 400 nm.

In the sample No. 1 as illustrated in FIG. 11, after forming the first electrode 11 containing an aluminum alloy and the transparent conductive layer 12 that is an IZO film having a thickness of 16 nm, the first electrode 11 and the transparent conductive layer 12 were baked together at 230° C. for one hour. The other manufacturing processes were performed according to the processes illustrated in FIGS. 3 to 7.

In the sample No. 2, after forming only the first electrode 11 containing an aluminum alloy and baking the first electrode 11 at 230° C. for one hour, the transparent conductive layer 12 that is an IZO film having a thickness of 5 nm was formed on the first electrode 11. The other manufacturing processes were performed according to the processes illustrated in FIGS. 4 to 8.

In the sample No. 3, after forming the first electrode 11 containing an aluminum alloy and the transparent conductive layer 12 that is an IZO film having a thickness of 5 nm, the first electrode 11 and the transparent conductive layer 12 were baked together at 230° C. for 15 minutes. The other manufacturing processes were performed according to the processes illustrated in FIGS. 3 to 7.

In the sample No. 4, after forming only the first electrode 11 containing an aluminum alloy and irradiating the first electrode 11 with UV, the transparent conductive layer 12 that is an IZO film having a thickness of 5 nm was formed on the first electrode 11. The other manufacturing processes were performed according to the processes illustrated in FIGS. 4 to 8.

In the sample No. 5, after forming the first electrode 11 containing an aluminum alloy and the transparent conductive layer 12 that is an IZO film having a thickness of 5 nm, the first electrode 11 and the transparent conductive layer 12 were baked together at 230° C. for 45 minutes. The other manufacturing processes were performed according to the processes illustrated in FIGS. 3 to 7.

In the sample No, 6, after forming the first electrode 11 containing an aluminum alloy and the transparent conductive layer 12 that is an IZO film having a thickness of 5 nm, the first electrode 11 and the transparent conductive layer 12 were baking together at 230° C. for 60 minutes. The other manufacturing processes were performed according to the processes illustrated in FIGS. 3 to 7.

XPS measured and calculated a component ratio between In, Zn, and O in the surface layer of the transparent conductive layer 12 from each of the six samples prepared as above. The component ratio between In, Zn, and O was normalized to In, and the relationship between the ratio of Zn and the driving voltage was plotted. In other words, the horizontal axis in FIG. 12 indicates the intensity of zinc detected by XPS with respect to that of In, that is, the ratio of Zn when In is represented by 1. Furthermore, the vertical axis in FIG. 12 indicates the driving voltage of the organic EL element 1, that is, a voltage for causing a current to flow through the organic EL element 1 at a current density of 10 mA/cm$^2$.

As illustrated in FIG. 12, the driving voltage suddenly rises when the ratio of Zn exceeds 0.25. This shows that the ratio of Zn with respect to In in the surface layer of the transparent conductive layer 12, that is, in the vicinity of the interface between the transparent conductive layer 12 and the hole injection layer 14 (closer to the light-emitting layer 16) should be set lower than or equal to 0.25 in the organic EL element 1. This setting can suppress increase in the driving voltage.

Furthermore, the result illustrated in FIG. 12 suggests that baking the first electrode 11 and the transparent conductive layer 12 together for a longer time may cause Zn to be liberated and undergo advanced diffusion according to the baking time. On the other hand, when only the first electrode 11 is baked, it is probable that Zn is not liberated or at least the diffusion of Zn can be suppressed. Thus, baking and oxidizing only the first electrode 11 in advance may suppress the redox reactions between the first electrode 11 and the transparent conductive layer 12. Thus, as illustrated in FIG. 8, the baking of the first electrode (metal layer) 11 should be performed before the forming of the transparent conductive layer 12.

When the ratio of Zn with respect to In in the surface layer of the IZO film (the transparent conductive layer 12) falls below 0.17, the IZO film is darkened by the excess of indium and becomes less transparent, thus resulting in the IZO film lacking in desired transparency and resistance value. Thus, the ratio of Zn wit respect to In in the surface layer of the IZO film should be set higher than or equal to 0.17.

Here, the reasons why the samples No. 1 to No. 6 exhibit the results in FIG. 12 will be described with reference to FIG. 13.

Figure 13:
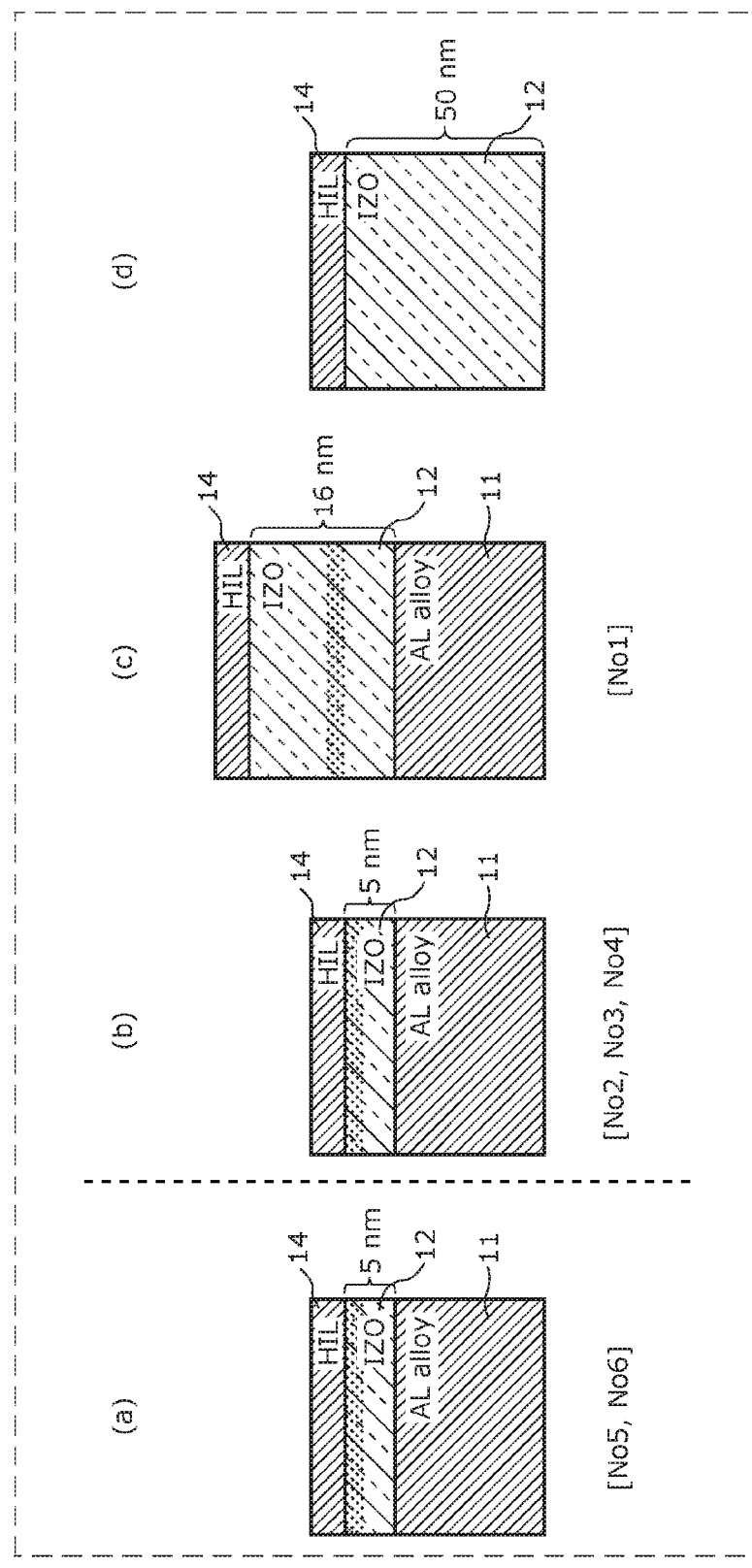
FIG. 13 illustrates cross sectional views of part of structures of organic EL elements prepared under different conditions.

As illustrated in (a) of FIG. 13, it is probable that the samples No. 5 and No. 6 underwent the redox reactions between the first electrode 11 and the transparent conductive layer 12 by the baking, and accordingly, Zn segregated in the surface layer of the transparent conductive layer 12, that is, in the vicinity of the interface between the transparent conductive layer 12 and the hole injection layer 14. In other words, Zn segregated because the first electrode 11 (aluminum alloy) consumed oxygen in the transparent conductive layer 12. It is probable that the driving voltage of the organic EL element 1 increased because the segregation of Zn worsened the junction level at the interface between the transparent conductive layer 12 and the hole injection layer 14.

In contrast, as illustrated in (b) of FIG. 13, since it seems that the samples No. 2, No. 3, and No. 4 had no or little segregation of Zn, or even the redox reactions for the short baking time (heating time), it is probable that the (amount of) segregation of Zn in the surface layer of the transparent conductive layer 12 was able to be suppressed. As a result, the driving voltage of the organic EL element probably did not increase.

Furthermore, as illustrated in (c) of FIG. 13, the sample No. 1 had segregation of Zn by the redox reactions between the first electrode 11 and the transparent conductive layer 12 through the baking. However, the segregation occurred not in the surface layer of the transparent conductive layer 12 but only inside the transparent conductive layer 12 because the transparent conductive layer 12 was thicker. As a result, it seems that the junction level at the interface between the transparent conductive layer 12 and the hole injection layer 14 was not worsened and that the driving voltage of the organic EL element did not increase.

Furthermore, as illustrated in (d) of FIG. 13, when an anode was composed of, for example, only the transparent conductive layer 12 having a thickness of 50 nm without having the first electrode of the aluminum alloy, segregation of Zn did not occur in the surface layer of the transparent conductive layer 12. This is because no redox reactions between the aluminum alloy of the first electrode 11 and IZO of the transparent conductive layer 12 occurs.

In comparison between the samples No. 1 and No. 2, the ratio of Zn in the sample No. 2 slightly increased more than that of the sample No. 1. This shows that the segregation of Zn slightly occurred when only the first electrode 11 (the sample No. 2) was baked. This is because a portion of aluminum could not be completely oxidized under this baking condition. Increase in the ratio of Zn to this extent did not cause increase in the voltage as illustrated in FIG. 12.

SUMMARY

As described above, in the organic EL element 1 and the organic EL display device 2 according to the embodiment each including: the first electrode (metal layer) 11; the transparent conductive layer 12 containing indium zinc oxide (IZO); and the light-emitting layer 16, wherein the first electrode 11, the transparent conductive layer 12, and the light-emitting layer 16 are stacked, and a ratio of zinc to indium in a vicinity of an interface of the transparent conductive layer 12 is lower than or equal to 0.25, the interface being closer to the light-emitting layer 16.

This structure can suppress increase in the driving voltage of the organic EL element 1 even when the transparent conductive layer 12 is made thinner. Thus, thinning the transparent conductive layer 12 enables obtainment of an organic EL element (i) that can emit light with deeper color (deeper blue light by the organic EL element that emits blue light) and (ii) whose increase in the driving voltage can be suppressed. Thus, the organic EL element can achieve desired characteristics.

Furthermore, the transparent conductive layer 12 may be approximately 5 nm or less in thickness according to the embodiment.

With this structure, the top-emission type organic EL element can reduce the interference between the direct light and the reflected light, and the color of the light emitted from the organic EL element can be easily deepened (deeper blue light by the organic EL element that emits blue light).

Furthermore, the first electrode (metal layer) 11 may contain aluminum.

When the first electrode 11 contains aluminum, segregation of Zn may occur in the transparent conductive layer 12 by the redox reactions between the aluminum in the first electrode 11 and IZO in the transparent conductive layer 12. However, since a ratio of Zn to In in the vicinity of the interface of the transparent conductive layer 12 that is closer to the light-emitting layer 16 is lower than or equal to 0.25, increase in the driving voltage of the organic EL element 1 can be suppressed.

Furthermore, the organic EL element 1 may include the hole injection layer 14 between the transparent conductive layer 12 and the light-emitting layer 16. Furthermore, the hole injection layer 14 may contain an organic amine.

The segregation of Zn in the transparent conductive layer 12 (IZO) may worsen the junction level at the interface between the transparent conductive layer 12 and the hole injection layer 14. However, since the ratio of Zn to In in the vicinity of the interface of the transparent conductive layer 12 that is closer to the light-emitting layer 16 is lower than or equal to 0.25. Thus, increase in the driving voltage of the organic EL element 1 can be suppressed.

Furthermore, the organic EL element 1 may include the electron block layer 15 between the hole injection layer 14 and the light-emitting layer 16.

This structure can prevent the electrons injected from the electron injection layer 17 from reaching the hole injection layer 14, thus obtaining the organic EL element having superior characteristics.

Furthermore, the method for manufacturing the organic EL element 1 according to the embodiment includes: forming the first electrode (metal layer) 11; forming the transparent conductive layer 12 above the first electrode 11, the transparent conductive layer 12 containing indium zinc oxide; oxidizing the first electrode 11; and forming the light-emitting layer 16 above the transparent conductive layer 12, wherein a ratio of zinc to indium in a vicinity of an interface of the transparent conductive layer 12 is lower than or equal to 0.25, the interface being closer to the light-emitting layer 16. Furthermore, examples of the oxidizing include baking the first electrode 11 or irradiating the first electrode 11 with ultraviolet rays.

These processes enable manufacturing of an organic EL element in which increase in the driving voltage can be suppressed even when the transparent conductive layer 12 is made thinner. Thus, the organic EL element can achieve desired characteristics.

Furthermore, the oxidizing may be performed after the forming of the transparent conductive layer 12.

With this process, the first electrode 11 and the transparent conductive layer 12 are oxidized together in the oxidizing of the first electrode 11. For example, when the first electrode 11 is baked, the first electrode 11 and the transparent conductive layer 12 under the first electrode 11 are baked together. Accordingly, segregation of Zn may occur in the transparent conductive layer 12 by the redox reactions between the first electrode 11 and the transparent conductive layer 12. However, since the ratio of Zn to In in the vicinity of the interface of the transparent conductive layer 12 that is closer to the light-emitting layer 16 is lower than or equal to 0.25. Thus, it is possible to manufacture the organic EL element in which increase in the driving voltage can be suppressed.

Alternatively, the oxidizing may be performed between the forming of the first electrode 11 and the forming of the transparent conductive layer 12.

With this process, the first electrode 11 can be oxidized before forming the transparent conductive layer 12. Since, for example, only the first electrode 11 can be baked and oxidized in advance, the diffusion of Zn in the transparent conductive layer 12 can be suppressed. Thus, the organic EL element in which increase in the driving voltage can be more suppressed than when oxidizing the first electrode 11 and the transparent conductive layer 12 together can be manufactured.

Furthermore, in the forming of the transparent conductive layer 12, the transparent conductive layer 12 may be formed with a thickness of approximately 5 nm or less.

With this process, it is possible to manufacture the top-emission type organic EL element in which the interference between the direct light and the reflected light can be reduced and which can easily emit light with deeper color (deeper blue light by the organic EL element that emits blue light).

Furthermore, the first electrode (metal layer) 11 may contain aluminum.

Accordingly, even when segregation of Zn occurs in the transparent conductive layer 12 by the redox reactions between the aluminum in the first electrode 11 and IZO in the transparent conductive layer 12, it is possible to manufacture the organic EL element in which increase in the driving voltage can be suppressed because the ratio of Zn to In in the vicinity of the interface of the transparent conductive layer 12 that is closer to the light-emitting layer 16 is lower than or equal to 0.25.

Furthermore, the method may include forming the hole injection layer 14 between the forming of the transparent conductive layer 12 and the forming of the light-emitting layer 16. Here, the hole injection layer 14 may contain an organic amine.

With these processes, the segregation of Zn in the transparent conductive layer 12 may worsen the junction level at the interface between the transparent conductive layer 12 and the hole injection layer 14. However, since the ratio of Zn to In in the vicinity of the interface of the transparent conductive layer 12 that is closer to the light-emitting layer 16 is lower than or equal to 0.25, it is possible to manufacture the organic EL element in which increase in the driving voltage can be suppressed.

Furthermore, the method may include forming the electron block layer 15 between the forming of the hole injection layer 14 and the forming of the light-emitting layer 16.

This process can prevent the electrons injected from the electron injection layer 17 from reaching the hole injection layer 14, thus obtaining the organic EL element having superior characteristics.

The organic EL element, the method for manufacturing the same, and the organic EL display device that are described based on the embodiment are not limited thereto.

For example, although the embodiment describes an organic EL element as an example of a light-emitting element, it is applicable to light-emitting elements other than the organic EL element.

Furthermore, although the embodiment describes an organic EL display device as an example of a display device, it is applicable to display devices other than the organic EL display device. Furthermore, the organic EL display device may be any of a passive-matrix drive system and an active-matrix drive system.

Furthermore, although the embodiment exemplifies the organic EL element 1 to be applied to a display device, the organic EL element 1 is applicable to light emitting devices other than display devices, such as luminaires.

Furthermore, the present invention involves various modifications to the embodiment that are conceived by the person skilled in the art, and other embodiments obtainable by combining the structural elements and functions of the embodiment, without materially departing from the scope of the present invention.

INDUSTRIAL APPLICABILITY

The techniques of the present disclosure are applicable to light-emitting elements such as organic EL elements and methods of manufacturing the same, and various electronic devices such as display devices and luminaires including the light-emitting elements.

REFERENCE SIGNS LIST

1 Organic EL element
2 Organic EL display device
3R, 3G, 3B Sub-pixel
10 Substrate
11 First electrode
12 Transparent conductive layer
13 Bank
14 Hole injection layer
15 Electron block layer
16 Light-emitting layer
17 Hole injection layer
18 Second electrode
19 Sealing layer

The invention claimed is:

1. A light-emitting element comprising:
   a metal layer;
   a transparent conductive layer containing indium zinc oxide; and
   a light-emitting layer,
   wherein the metal layer, the transparent conductive layer, and the light-emitting layer are stacked, and
   a ratio of zinc to indium in a surface layer of the transparent conductive layer is lower than or equal to 0.25, the surface layer facing the light-emitting layer.

2. The light-emitting element according to claim 1,
   wherein the transparent conductive layer is approximately 5 nm or less in thickness.

3. The light-emitting element according to claim 1,
   wherein the metal layer contains aluminum.

4. The light-emitting element according to claim 1, further comprising
   a hole injection layer is disposed between the transparent conductive layer and the light-emitting layer.

5. The light-emitting element according to claim 4,
   wherein the hole injection layer contains an organic amine.

6. The light-emitting element according to claim 4, further comprising
   an electron block layer is disposed between the hole injection layer and the light-emitting layer.

7. A display device, comprising
   the light-emitting element according to claim 1.

8. A method for manufacturing a light-emitting element, the method comprising:
   forming a metal layer;
   forming a transparent conductive layer above the metal layer, the transparent conductive layer containing indium zinc oxide;
   oxidizing the metal layer; and
   forming a light-emitting layer above the transparent conductive layer,
   wherein a ratio of zinc to indium in a surface layer of the transparent conductive layer is lower than or equal to 0.25, the surface layer facing the light-emitting layer.

9. The method according to claim 8,
   wherein the oxidizing includes baking the metal layer or irradiating the metal layer with ultraviolet rays.

10. The method according to claim 8,
wherein the oxidizing is performed after the forming of the transparent conductive layer.

11. The method according to claim 8,
wherein the oxidizing is performed between the forming of the metal layer and the forming of the transparent conductive layer.

12. The method according to claim 8,
wherein in the forming of the transparent conductive layer, the transparent conductive layer is formed with a thickness of approximately 5 nm or less.

13. The method according to claim 8,
wherein the metal layer contains aluminum.

14. The method according to claim 8, further comprising
forming a hole injection layer between the forming of the transparent conductive layer and the forming of the light-emitting layer.

15. The method according to claim 14,
wherein the hole injection layer contains an organic amine.

16. The method according to claim 14, further comprising
forming an electron block layer between the forming of the hole injection layer and the forming of the light-emitting layer.

17. The light-emitting element according to claim 1, wherein
the indium zinc oxide contained in the transparent conductive layer is in contact with the metal layer,
the metal layer contains a metallic element having a lower ionization potential than zinc, and
the transparent conductive layer has a thickness of 5 nm or less.

18. The light-emitting element according to claim 1, further comprising
forming a zinc segregation layer in the surface layer of the transparent conductive layer, the zinc segregation layer being positioned closer to the light-emitting layer than a remaining portion of the surface layer.

19. The light-emitting element according to claim 1, wherein
the transparent conductive layer is formed directly on the metal layer, and
the metal layer contains an aluminum alloy.

20. The light-emitting element according to claim 1, wherein
wherein the ratio of zinc to indium in the surface layer of the transparent conductive layer is higher than or equal to 0.17.

21. The light-emitting element according to claim 1, wherein
the transparent conductive layer permits passing of certain wavelengths of light while blocking others to modify a color of the light passing therethrough.

* * * * *